(12) United States Patent
Tallman

(10) Patent No.: US 7,139,669 B2
(45) Date of Patent: Nov. 21, 2006

(54) SOFTWARE CLAMPING OF VIDEO SIGNALS

(75) Inventor: James L. Tallman, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/866,952

(22) Filed: Jun. 14, 2004

(65) Prior Publication Data

US 2005/0288879 A1    Dec. 29, 2005

(51) Int. Cl.
*G01R 13/00* (2006.01)
*G06F 19/00* (2006.01)
(52) U.S. Cl. .................................... 702/66
(58) Field of Classification Search ............ 702/66, 702/67, 70, 71, 189, 190, 193, 194; 324/76.12, 324/76.13, 76.15
See application file for complete search history.

(56) References Cited

U.S. PATENT DOCUMENTS 4,203,029 A * 5/1980 Kitchener et al. ............ 377/10
6,219,094 B1 * 4/2001 Gerlach et al. ............. 348/184

* cited by examiner

*Primary Examiner*—Michael Nghiem
(74) *Attorney, Agent, or Firm*—Francis I. Gray; Matthew D. Rabdau

(57) ABSTRACT

A method of software clamping a video signal for waveform display on a general purpose oscilloscope where the video signal is a.c. coupled to an input of the oscilloscope includes acquiring samples of the video signal in response to a trigger signal derived from the video signal, which samples are then stored. Then samples relative to the trigger signal that are at a nominally known voltage are retrieved, averaged and compared to a reference value. The reference value may be a value determined from a first acquisition of the video signal or a value corresponding to the nominally known voltage. The difference between the averaged samples and the reference value is then used to adjust the sample values when retrieved for display by the oscilloscope.

4 Claims, 1 Drawing Sheet

SOFTWARE CLAMPING OF VIDEO SIGNALS

BACKGROUND OF THE INVENTION

The present invention relates to the processing of video signals, and particularly to software clamping of video signals.

Instruments for making measurements on video signals, such as waveform monitors, are specialized oscilloscopes which include hardware for clamping video signals. Such clamping is required when the source video signal is AC coupled because the signal's vertical level shifts as the active picture level shifts. As a result waveform monitors typically clamp either a back porch portion or a sync tip portion of the composite video signal to a specified DC voltage so that the signal's vertical level does not shift as the active picture level shifts.

However general purpose oscilloscopes do not include hardware necessary for clamping video signals. Therefore in order to use general purpose oscilloscopes for making video signal measurements, an external video display clamp is required prior to video signal input to and acquisition by the general purpose oscilloscope.

What is desired is a method of providing clamping of video signals input to a general purpose oscilloscope without the requirement of added hardware, such as an external video display clamp.

BRIEF SUMMARY OF THE INVENTION

Accordingly the present invention provides a method for software clamping of video signals for waveform display on a general purpose oscilloscope where the video signal is a.c. coupled to an input of the oscilloscope. The method includes acquiring samples of the video signal in response to a trigger signal derived from the video signal, which samples are then stored. Then samples at a point of time relative to the trigger signal that are at a nominally known voltage according to a video standard are retrieved, averaged and compared to a reference value. The reference value may be a value determined from a first acquisition of the video signal or a value corresponding to the nominally known voltage. The reference value comprises averaged samples from a first acquisition of the video signal corresponding to the known voltage level. The difference between the averaged samples and the reference value is then used to adjust the sample values when retrieved for waveform display by the oscilloscope.

The objects, advantages and other novel features of the present invention are apparent from the following detailed description when read in conjunction with the appended claims and attached drawing.

DETAILED DESCRIPTION OF THE INVENTION

As is well known in the art a video signal, such as an NTSC composite signal or one of the components of an analog component signal, represents a video image or frame in the form of successive lines of video data, where each line is a horizontal scan from left to right across an imaging device such as a cathode ray tube (CRT) or the like. Each line is separated from another by a horizontal sync interval (during which time the horizontal scan returns to the left side of the imaging device) that includes a sync pulse followed by a back porch portion. The sync pulse and back porch portions have defined DC voltage levels according to the appropriate video standard. The remainder of the line, except those lines that make up a vertical retrace interval when the scan returns to the upper left corner of the imaging device, provides the active video or image data which varies from line to line and frame to frame. Thus when such a signal is AC coupled at the input of an oscilloscope, the average DC value of the line changes due to changes in the active video data which result in the waveform display moving up and down.

Figure 1:
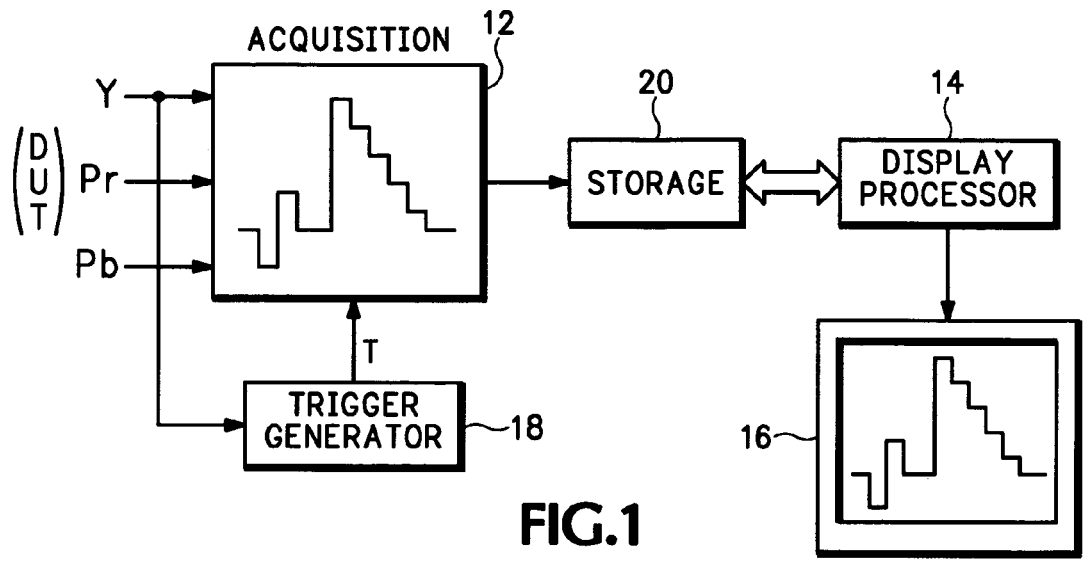
FIG. 1 is a block diagram view of a representative general purpose oscilloscope having software clamping of video signals according to the present invention.

A general purpose oscilloscope, as shown generically in FIG. 1, has an acquisition module 12, a data processing module 14 and a display module 16. The acquisition module 12 receives AC coupled signals and a trigger signal derived from the video signal via a trigger generator module 18. The received signals are digitized and stored in a memory 20 in the form of data samples having (i) an amplitude and (ii) a time value relative to the trigger signal for further processing by the data processing module 14.

Figure 2:
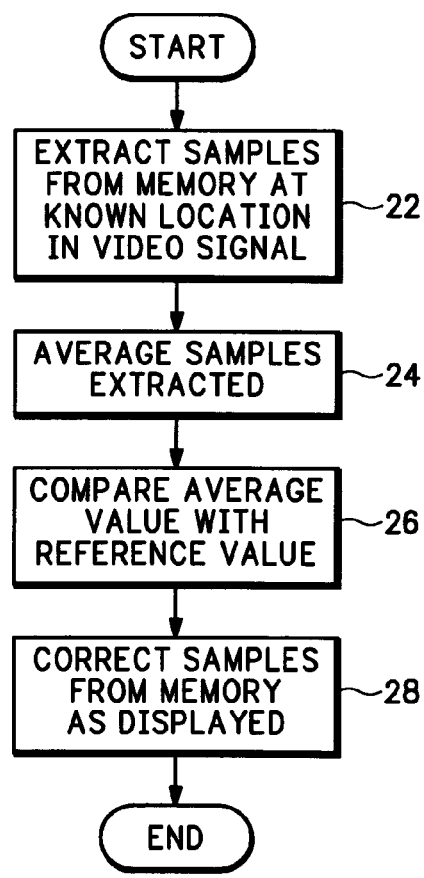
FIG. 2 is a flow chart view of the method of software clamping of video signals according to the present invention.

Referring now to FIG. 2, since the format of the video signal is well defined, the location of samples for the sync tip of the sync signal and for the back porch are known relative to the trigger signal. So simply by counting the number of samples from the trigger point, those samples related to the sync tip and/or back porch are extracted (step 22) from the stored data samples for the acquired line of video data. For a better result the samples for the sync tip or back porch may be averaged (step 24) rather than just using a single sample value. The resulting value is then compared (step 26) either (i) with the corresponding value for a reference line or (ii) with the corresponding known voltage value, and the difference is used as a correction value (step 28) for each sample when the stored line data is transferred for display to the display module.

As a result the display does not move vertically as each line of video data is displayed. Although the present invention is described in the context of acquiring one line at a time, it is applicable to any acquisition interval of one or multiple lines. For multiple lines the samples for each back porch or sync tip are extracted, averaged and compared with a reference value to maintain the relative vertical position of the display from acquisition to acquisition.

Thus the present invention provides a method of software clamping video signals for a general purpose oscilloscope to provide a steady display by taking acquired samples of the video signal at known locations having known nominal voltage values, averaging the samples, comparing the average to a reference value, and then applying the difference to all sample values when the acquired samples are displayed.

What is claimed is:

1. A method of software clamping a video signal when displayed on a general purpose oscilloscope comprising the steps of:

acquiring samples of the video signal in response to a trigger signal derived from the video signal;

averaging samples from the acquired samples that correspond to a known voltage level in the video signal;

comparing the averaged samples with a reference value comprising averaged samples from a first acquisition of the video signal corresponding to the known voltage level to obtain a difference value; and adjusting the acquired samples by the difference value when the samples are presented for display.

2. The method as recited in claim 1 wherein the reference value comprises a value corresponding to the known voltage level.

3. The method as recited in claim 1 wherein the known voltage level comprises a horizontal sync tip voltage level.

4. The method as recited in claim 1 wherein the known voltage level comprises a back porch voltage level.

* * * * *